United States Patent
Chen et al.

(10) Patent No.: US 10,269,968 B2
(45) Date of Patent: Apr. 23, 2019

(54) SEMICONDUCTOR DEVICE INCLUDING FIN STRUCTURES AND MANUFACTURING METHOD THEREOF

(71) Applicant: TAIWAN SEMICONDUCTOR MANUFACTURING CO., LTD., Hsinchu (TW)

(72) Inventors: Yi-Jen Chen, Hsinchu (TW); Chia-Chun Liao, Hsinchu (TW); Chun-Sheng Liang, Changhua County (TW); Shih-Hsun Chang, Hsinchu (TW); Jen-Hsiang Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/730,210

(22) Filed: Jun. 3, 2015

(65) Prior Publication Data
US 2016/0359043 A1    Dec. 8, 2016

(51) Int. Cl.
*H01L 29/66* (2006.01)
*H01L 29/78* (2006.01)
(Continued)

(52) U.S. Cl.
CPC .... *H01L 29/7851* (2013.01); *H01L 29/66545* (2013.01); *H01L 29/66818* (2013.01);
(Continued)

(58) Field of Classification Search
CPC ............. H01L 29/66795; H01L 29/785; H01L 21/02532; H01L 29/0649; H01L 29/165;
(Continued)

(56) References Cited

U.S. PATENT DOCUMENTS 7,425,740 B2    9/2008  Liu et al.
7,838,373 B2 *  11/2010 Giles ............... H01L 23/485
                                                  257/386
(Continued)

FOREIGN PATENT DOCUMENTS

CN    103915504 A    7/2014
KR    10-1382846 B1  4/2014
(Continued)

*Primary Examiner* — Jay C Kim
(74) *Attorney, Agent, or Firm* — McDermott Will & Emery LLP

(57) ABSTRACT

A method of manufacturing a semiconductor Fin FET includes forming a fin structure over a substrate. The fin structure includes an upper layer, part of which is exposed from an isolation insulating layer. A dummy gate structure is formed over part of the fin structure. The dummy gate structure includes a dummy gate electrode layer and a dummy gate dielectric layer. A source and a drain are formed. The dummy gate electrode is removed so that the upper layer covered by the dummy gate dielectric layer is exposed. The upper layer of the fin structure is removed to make a recess formed by the dummy gate dielectric layer. Part of the upper layer remains at a bottom of the recess. A channel layer is formed in the recess. The dummy gate dielectric layer is removed. A gate structure is formed over the channel layer.

19 Claims, 9 Drawing Sheets

(51) Int. Cl.
*H01L 29/165* (2006.01)
*H01L 21/02* (2006.01)

(52) U.S. Cl.
CPC ...... *H01L 29/7848* (2013.01); *H01L 29/7849* (2013.01); *H01L 21/0262* (2013.01); *H01L 21/02532* (2013.01); *H01L 29/165* (2013.01)

(58) Field of Classification Search
CPC ......... H01L 29/66545; H01L 29/66818; H01L 29/7848; H01L 29/7849; H01L 29/7851
USPC ........................................................ 257/192
See application file for complete search history.

(56) References Cited

U.S. PATENT DOCUMENTS

| | | | |
|---|---|---|---|
| 7,923,337 B2* | 4/2011 | Chang | H01L 29/66545 257/346 |
| 7,939,889 B2* | 5/2011 | Yu | H01L 29/66795 257/347 |
| 8,048,723 B2 | 11/2011 | Chang et al. | |
| 8,053,299 B2 | 11/2011 | Xu | |
| 8,183,627 B2 | 5/2012 | Currie | |
| 8,415,718 B2 | 4/2013 | Xu | |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,618,636 B1* | 12/2013 | Chang | H01L 29/42304 257/565 |
| 8,633,516 B1 | 1/2014 | Wu et al. | |
| 8,637,359 B2* | 1/2014 | Chang | H01L 29/66545 257/347 |
| 8,647,937 B2* | 2/2014 | Toh | H01L 29/66545 438/183 |
| 8,652,932 B2* | 2/2014 | Adam | H01L 29/66545 438/424 |
| 8,691,650 B2* | 4/2014 | Cheng | H01L 29/66772 257/E21.407 |
| 8,697,523 B2* | 4/2014 | Cai | H01L 29/66545 257/190 |
| 8,703,565 B2 | 4/2014 | Chang et al. | |
| 8,716,156 B1* | 5/2014 | Pawlak | H01L 21/82382 438/770 |
| 8,723,272 B2* | 5/2014 | Liu | H01L 29/66795 257/401 |
| 8,729,634 B2 | 5/2014 | Shen et al. | |
| 8,735,232 B2* | 5/2014 | Baars | H01L 21/31111 438/149 |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,809,139 B2* | 8/2014 | Huang | H01L 21/823807 257/E21.176 |
| 8,815,693 B2* | 8/2014 | Alptekin | H01L 29/66477 438/295 |
| 8,815,712 B2 | 8/2014 | Wan et al. | |
| 8,946,035 B2* | 2/2015 | Huang | H01L 29/66477 257/288 |
| 9,006,842 B2* | 4/2015 | Colinge | H01L 29/7843 257/401 |
| 9,093,531 B2* | 7/2015 | Chen | H01L 29/785 |
| 9,159,824 B2* | 10/2015 | Lee | H01L 29/66431 |
| 9,171,925 B2* | 10/2015 | Kuo | H01L 29/66545 |
| 9,178,067 B1* | 11/2015 | Ching | H01L 29/0607 |
| 9,190,486 B2* | 11/2015 | Xie | H01L 29/66545 |
| 9,196,522 B2* | 11/2015 | Ching | H01L 21/76205 |
| 9,276,087 B2* | 3/2016 | Kim | H01L 29/66545 |
| 9,281,378 B2* | 3/2016 | Ching | H01L 29/66545 |
| 9,299,809 B2* | 3/2016 | Brunco | H01L 29/66795 |
| 9,362,386 B2* | 6/2016 | Huang | H01L 29/66977 |
| 9,362,405 B1* | 6/2016 | Jacob | H01L 29/7851 |
| 9,391,181 B2* | 7/2016 | Chu-Kung | H01L 29/66393 |
| 9,391,201 B2* | 7/2016 | Huang | H01L 29/7848 |
| 9,431,485 B2* | 8/2016 | Ahmed | H01L 29/1045 |
| 9,431,523 B2* | 8/2016 | Cheng | H01L 29/66818 |
| 9,466,696 B2* | 10/2016 | Mor | H01L 29/66628 |
| 9,496,338 B2* | 11/2016 | Chang | H01L 21/02532 |
| 9,502,567 B2* | 11/2016 | Chang | H01L 29/785 |
| 9,601,381 B2* | 3/2017 | Loubet | H01L 29/785 |
| 10,049,938 B2* | 8/2018 | Wang | H01L 21/82348 |
| 10,147,817 B2* | 12/2018 | Glass | H01L 29/7848 |
| 2005/0263795 A1* | 12/2005 | Choi | H01L 29/66795 257/213 |
| 2006/0030093 A1* | 2/2006 | Zhang | H01L 29/66628 438/197 |
| 2012/0319211 A1* | 12/2012 | van Dal | H01L 29/66795 257/401 |
| 2013/0049068 A1* | 2/2013 | Lin | H01L 29/7853 257/192 |
| 2013/0249003 A1* | 9/2013 | Oh | H01L 21/845 257/347 |
| 2013/0270628 A1* | 10/2013 | Huang | H01L 29/0847 257/329 |
| 2013/0277746 A1* | 10/2013 | Baldauf | H01L 21/823807 257/368 |
| 2013/0285141 A1* | 10/2013 | Kuo | H01L 29/66545 257/347 |
| 2013/0285153 A1 | 10/2013 | Lee et al. | |
| 2013/0341639 A1* | 12/2013 | Toh | H01L 29/66545 257/77 |
| 2014/0070328 A1* | 3/2014 | Goto | H01L 21/82343 257/401 |
| 2014/0145242 A1* | 5/2014 | Huang | H01L 21/823807 257/192 |
| 2014/0175561 A1* | 6/2014 | Colinge | H01L 29/785 257/401 |
| 2014/0183599 A1* | 7/2014 | Hong | H01L 29/785 257/190 |
| 2014/0183600 A1 | 7/2014 | Huang et al. | |
| 2014/0183643 A1* | 7/2014 | Colinge | H01L 21/82343 257/368 |
| 2014/0197456 A1* | 7/2014 | Wang | H01L 29/785 257/192 |
| 2014/0217483 A1* | 8/2014 | Choi | H01L 29/785 257/288 |
| 2014/0239399 A1* | 8/2014 | Nagumo | H01L 29/785 257/347 |
| 2014/0252469 A1* | 9/2014 | Lee | H01L 29/66431 257/337 |
| 2014/0264590 A1 | 9/2014 | Yu et al. | |
| 2014/0264592 A1 | 9/2014 | Oxland et al. | |
| 2014/0299934 A1* | 10/2014 | Kim | H01L 29/7848 257/347 |
| 2014/0312398 A1* | 10/2014 | Ching | H01L 29/66795 257/288 |
| 2015/0008483 A1* | 1/2015 | Ching | H01L 29/7856 257/190 |
| 2015/0144999 A1* | 5/2015 | Ching | H01L 29/66795 257/190 |
| 2015/0145003 A1 | 5/2015 | Rodder et al. | |
| 2016/0013313 A1* | 1/2016 | Cheng | H01L 29/267 257/408 |
| 2016/0351701 A1* | 12/2016 | Cea | H01L 29/785 |
| 2017/0133376 A1* | 5/2017 | Glass | H01L 29/66545 |

FOREIGN PATENT DOCUMENTS

| | | |
|---|---|---|
| KR | 10-2015-0044412 A | 4/2015 |
| KR | 10-2015-0060595 A | 6/2015 |
| TW | 201421693 A | 6/2014 |

* cited by examiner

SEMICONDUCTOR DEVICE INCLUDING FIN STRUCTURES AND MANUFACTURING METHOD THEREOF

TECHNICAL FIELD

The disclosure relates to a semiconductor integrated circuit, and more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the Fin FET utilizing, for example, silicon germanium (SiGe), silicon carbide (SiC), and/or silicon phosphide (SiP) may be used to enhance carrier mobility. For example, compressive stress applied to a channel of a PMOS device advantageously enhances hole mobility in the channel. Similarly, tensile stress applied to a channel of an NMOS device advantageously enhances electron mobility in the channel. However, there are challenges to the implementation of such features and processes in complementary metal-oxide-semiconductor (CMOS) fabrication.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
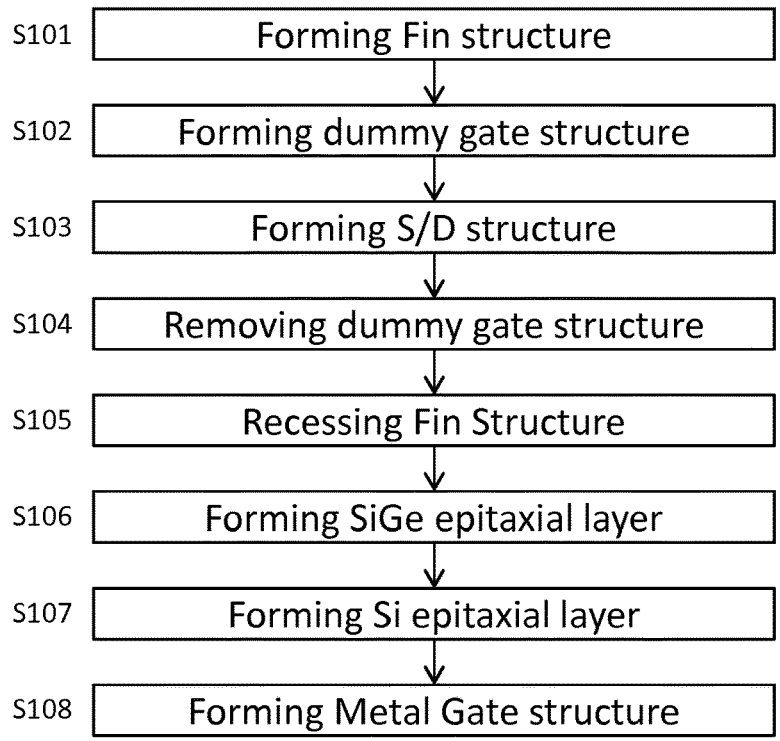
FIG. 1 is an exemplary process flow chart for manufacturing a semiconductor FET device having a fin structure (Fin FET).

FIG. 1 is an exemplary flow chart for manufacturing a semiconductor FET device having a fin structure (Fin FET). The flow chart illustrates only a relevant part of the entire manufacturing process for a Fin FET device. It is understood that additional operations may be provided before, during, and after processes shown by FIG. 1, and some of the operations described below can be replaced or eliminated for additional embodiments of the method. The order of the operations/processes may be interchangeable.

Figure 2:
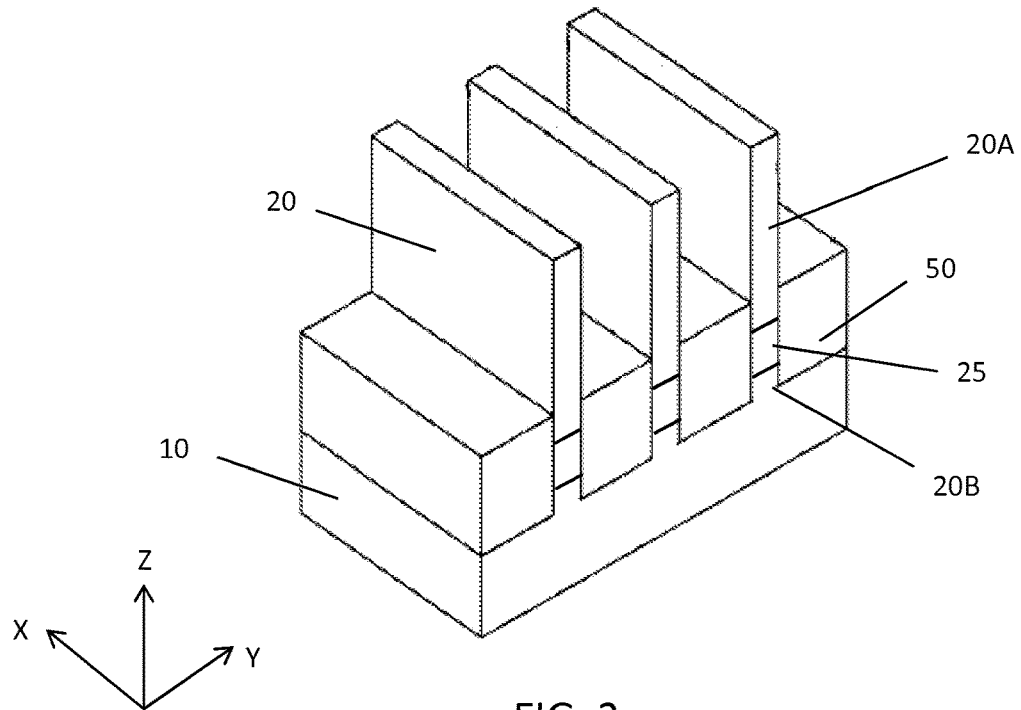
FIGS. 2-12 show exemplary processes for manufacturing the Fin FET device according to one embodiment of the present disclosure.

In S101 of FIG. 1, a fin structure is fabricated over a substrate 10 as shown in FIG. 2. FIG. 2 is an exemplary perspective view of the Fin FET device at one of the various stages of the fabrication process according to one embodiment.

Fin structures 20 are formed over a substrate 10 and protrude from an isolation insulating layer 50. In one embodiment, each of the fin structures 20 includes a base layer 20B, an intermediate layer 25 and an upper layer 20A. In the present embodiment, the base layer 20B and the upper layer 20A include silicon and the intermediate layer 25 includes $Si_{1-x}Ge_x$, where x is 0.1 to 0.9. Hereinafter, $Si_{1-x}Ge_x$ may be simply referred to as SiGe. The intermediate layer 25 is optional in some embodiments.

To fabricate a fin structure according to one embodiment, a mask layer is formed over a stack of Si/SiGe/Si multiplayers disposed over the substrate 10. The mask layer is formed by, for example, a thermal oxidation process and/or a chemical vapor deposition (CVD) process. The substrate 10 is, for example, a p-type silicon substrate with an impurity concentration in a range of about $1 \times 10^{15}$ $cm^{-3}$ to about $1 \times 10^{18}$ $cm^{-3}$. In other embodiments, the substrate 10 is an n-type silicon substrate with an impurity concentration in a range of about $1 \times 10^{15}$ $cm^{-3}$ to about $1 \times 10^{18}$ $cm^{-3}$. Each layer of the stack of Si/SiGe/Si is formed by epitaxial growth. The mask layer includes, for example, a pad oxide (e.g., silicon oxide) layer and a silicon nitride mask layer in some embodiments.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range of about 5 nm to about 40 nm in some embodiments. In certain embodiments, the width of the hard mask patterns is in a range of about 7 nm to about 12 nm.

By using the hard mask pattern as an etching mask, the stack of Si/SiGe/Si is patterned into fin structures 20 by trench etching using a dry etching method and/or a wet etching method. A height of the fin structure 20 is in a range of about 20 nm to about 300 nm. In certain embodiments, the height is in a range of about 30 nm to about 60 nm. When the heights of the fin structures are not uniform, the height from the substrate may be measured from the plane that corresponds to the average heights of the fin structures. The width of the fin structures 20 is in a range of about 7 nm to about 15 nm.

In this embodiment, a bulk silicon wafer is used as the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20. Each layer of the Si/SiGe/Si stack is appropriately doped.

As shown in FIG. 2, three fin structures 20 extending in the X direction are disposed adjacent to each other in the Y direction. However, the number of the fin structures is not limited to three. The numbers may be one, two, four or five or more. In addition, one of more dummy fin structures may be disposed adjacent to both sides of the fin structures 20 to improve pattern fidelity in patterning processes. The width of the fin structure 20 is in a range of about 5 nm to about 40 nm in some embodiments, and may be in a range of about 7 nm to about 15 nm in certain embodiments. The height of the fin structure 20 is in a range of about 100 nm to about 300 nm in some embodiments, and may be in a range of about 50 nm to about 100 nm in other embodiments. The space between the fin structures 20 is in a range of about 5 nm to about 80 nm in some embodiments, and may be in a range of about 7 nm to about 15 nm in other embodiments. One skilled in the art will realize, however, that the dimensions and values recited throughout the descriptions are merely examples, and may be changed to suit different scales of integrated circuits.

In this embodiment, the Fin FET device is a p-type Fin FET. However, the technologies disclosed herein are also applicable to an n-type Fin FET.

After forming the fin structures 20, an isolation insulating layer 50 is formed over the fin structures 20.

The isolation insulating layer 50 includes one or more layers of insulating materials, for example, silicon dioxide, silicon oxynitride and/or silicon nitride formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN or fluoride-doped silicate glass (FSG) in some embodiments.

After forming the isolation insulating layer 50 over the fin structures 20, a planarization operation is performed so as to remove part of the isolation insulating layer 50 and the mask layer (the pad oxide layer and the silicon nitride mask layer). The planarization operation may include a chemical mechanical polishing (CMP) and/or an etch-back process. Then, the isolation insulating layer 50 is further removed so that the upper layer 20A of the fin structure 20 is exposed, as shown in FIG. 2.

In certain embodiments, the partially removing the isolation insulating layer 50 may be performed using a wet etching process, for example, by dipping the substrate in hydrofluoric acid (HF). In another embodiment, the partially removing the isolation insulating layer 50 may be performed using a dry etching process. For example, a dry etching process using $CHF_3$ or $BF_3$ as etching gases may be used.

After forming the isolation insulating layer 50, a thermal process, for example, an anneal process, may be performed to improve the quality of the isolation insulating layer 50. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Figure 3:
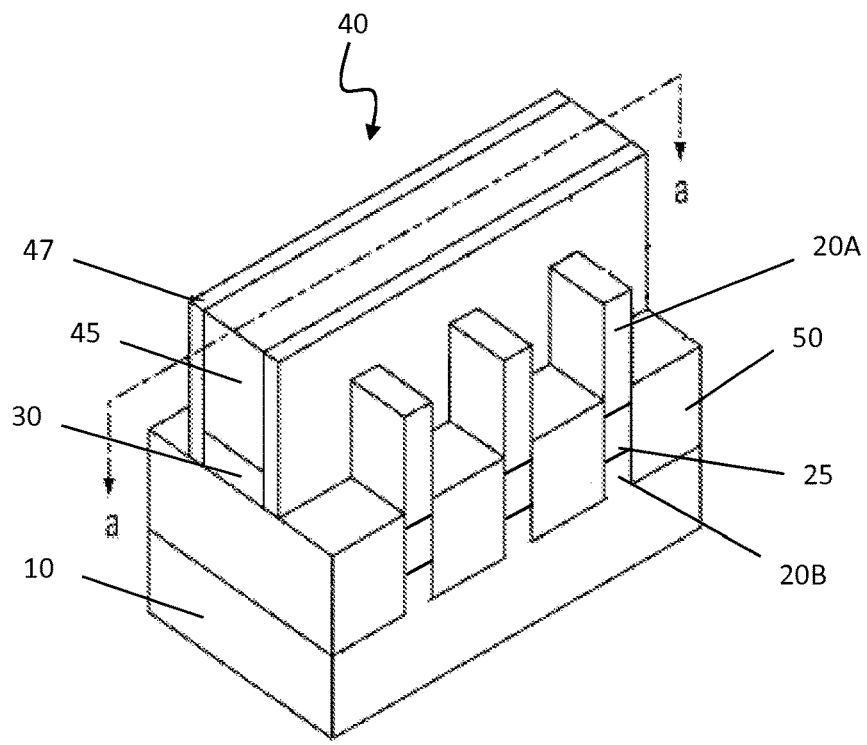
Figure 4:
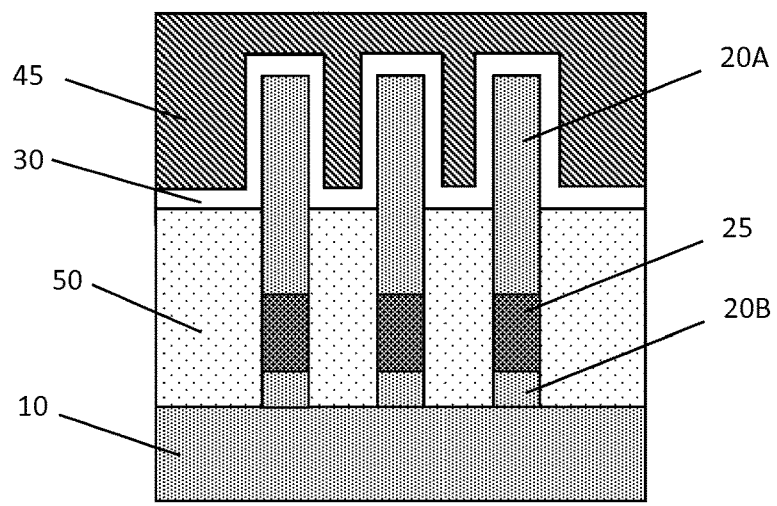

In S102 of FIG. 1, a dummy gate structure 40 is formed over part of the fin structures 20 as shown in FIG. 3. FIG. 3 is an exemplary perspective view of the Fin FET device at one of the various stages of the fabrication process according to one embodiment. FIG. 4 is an exemplary cross sectional view along the line a-a of FIG. 3.

A dielectric layer and a poly silicon layer are formed over the isolation insulating layer 50 and the exposed fin structures 20A, and then patterning operations are performed so as to obtain a dummy gate structure 40 including a dummy gate electrode layer 45 made of poly silicon and a dummy gate dielectric layer 30. The patterning of the poly silicon layer is performed by using a hard mask including a silicon nitride layer formed over an oxide layer in some embodiments. In other embodiments, the hard mask may include a silicon oxide layer formed over a nitride layer. The dummy gate dielectric layer 30 may be silicon oxide formed by CVD, PVD, ALD, e-beam evaporation, or other suitable process. In some embodiments, the gate dielectric layer 30 may include one or more layers of silicon oxide, silicon nitride, silicon oxy-nitride, or high-k dielectrics. In some embodiments, a thickness of the gate dielectric layer is in a range of about 5 nm to about 20 nm, and in a range of about 5 nm to about 10 nm in other embodiments.

In some embodiments, the gate electrode layer 45 may comprise a single layer or multilayer structure. The dummy gate electrode layer 45 may be doped poly silicon with uniform or non-uniform doping. The dummy gate electrode layer 45 may be formed using a suitable process such as ALD, CVD, PVD, plating, or combinations thereof. In the present embodiment, the width of the dummy gate electrode layer 45 is in the range of about 30 nm to about 60 nm. In some embodiments, a thickness of the gate electrode layer is in a range of about 30 nm to about 50 nm.

The dummy gate structure 40 further includes side-wall insulating layers 47 disposed over both main sides of the dummy gate electrode 45. The side-wall insulating layers 47 may include one or more layers of silicon oxide, silicon nitride, silicon oxy-nitride, or other suitable material. The side-wall insulating layers 47 may comprise a single layer or multilayer structure. A blanket layer of a side-wall insulating material may be formed by CVD, PVD, ALD, or other suitable technique. Then, an anisotropic etching is performed on the side-wall insulating material to form a pair of side-wall insulating layers (spacers) 47 on two main sides of the gate structure. The thickness of the side-wall insulating layers 47 is in a range of about 5 nm to about 30 nm in some embodiments, and in a range of about 10 nm to about 20 nm in other embodiments.

Figure 5:
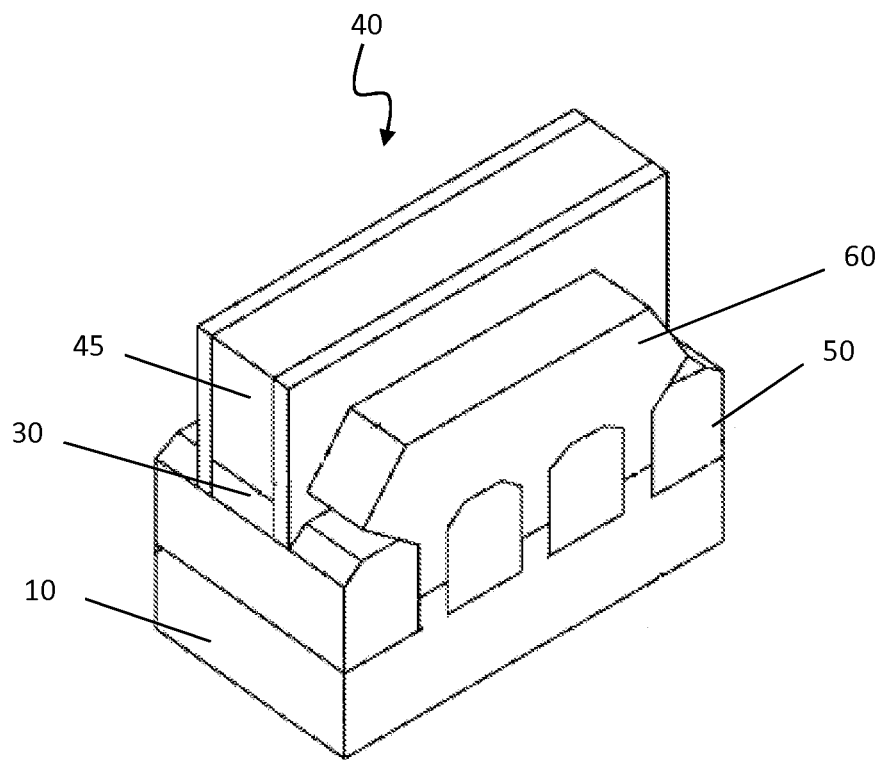

In S103 of FIG. 1, a source/drain structure is formed, as shown in FIG. 5. FIG. 5 is an exemplary perspective view of the Fin FET device at one of the various stages of the fabrication process according to one embodiment.

The portion of upper layers 20A not covered by the dummy gate structure 40 are etched down to form a recessed portions. The upper layers 20A of the fin structures are etched to the level of the base layer 20B in some embodiments.

Then, an appropriate strain layer 60 is formed in the recessed portions. In some embodiments, the strain layer includes multiple layers including Si or SiGe. In this embodiment, Si is epitaxially formed in the recessed portions.

In FIG. 5, the strain layer 60 is formed above the isolation insulating layer 50 and merged with the adjacent strain layer. However, the strain layers 60 may not be merged and may be formed individually from the respective recessed portions. The strain layers 60 become the source or drain of the Fin FET device.

Figure 6:
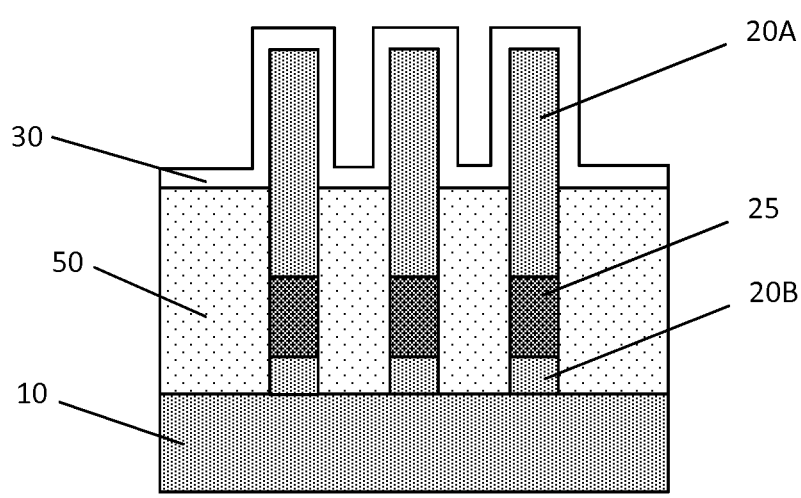

In S104 of FIG. 1, the dummy gate electrode 45 is removed, as shown in FIG. 6. FIG. 6 is an exemplary cross sectional view along the Y direction at one of the various stages of the fabrication process according to one embodiment.

The poly silicon of the dummy gate electrode 45 may be removed by wet etching and/or dry etching. During the etching of the dummy gate electrode 45, the strain layers 60 may be covered by a cover layer such as a photoresist, silicon nitride or silicon oxide.

Figure 7:
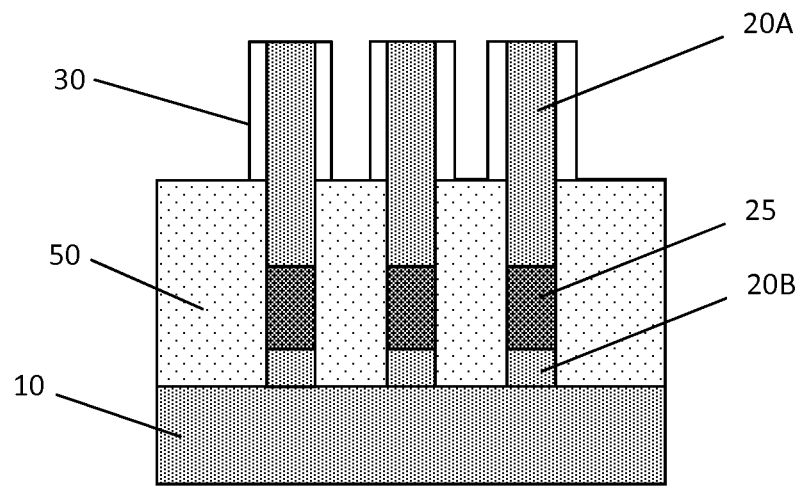
Figure 8:
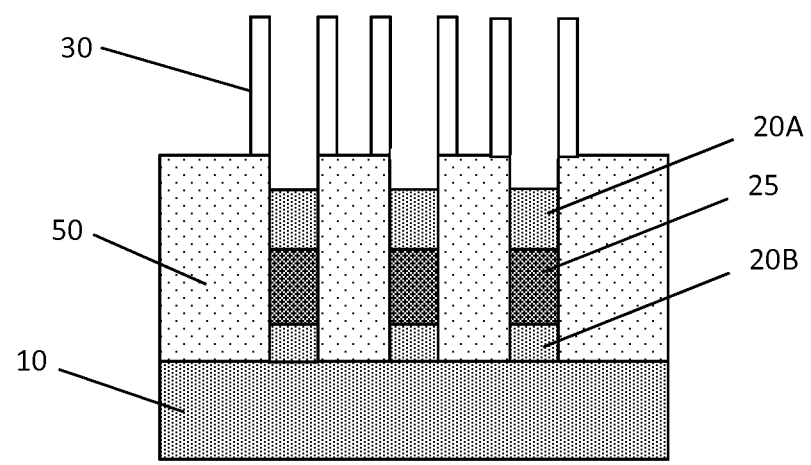

In S105 of FIG. 1, the upper layers 20A of the fin structures 20 are recessed. FIGS. 7 and 8 are exemplary cross sectional views along the Y direction at various stages of the fabrication process according to one embodiment.

As shown in FIG. 7, a top of the dummy gate dielectric 30 that covers the top surface of the upper layer 20A is removed by using, for example anisotropic dry etching.

As shown in FIG. 8, part of the upper layers 20A of the fin structures 20 are removed (recessed) down below the upper surface of the isolation insulating layer 50. The dummy gate dielectric 30 may be etched by using a fluorine containing gas (e.g., $NF_3$) at a pressure of about 1 to 10 mTorr, and the upper layer 20A may be etched by using a fluorine containing gas (e.g., $NF_3$), $H_2$ and inert gas (e.g., Ar) at a pressure of about 200 to 600 mTorr, in some embodiments.

The depth of the recess measured from the upper surface of the isolation insulating layer 50 is in a range of 5 nm to 50 nm in some embodiments, and in a range of 10 nm to 30 nm in other embodiments.

Figure 9:
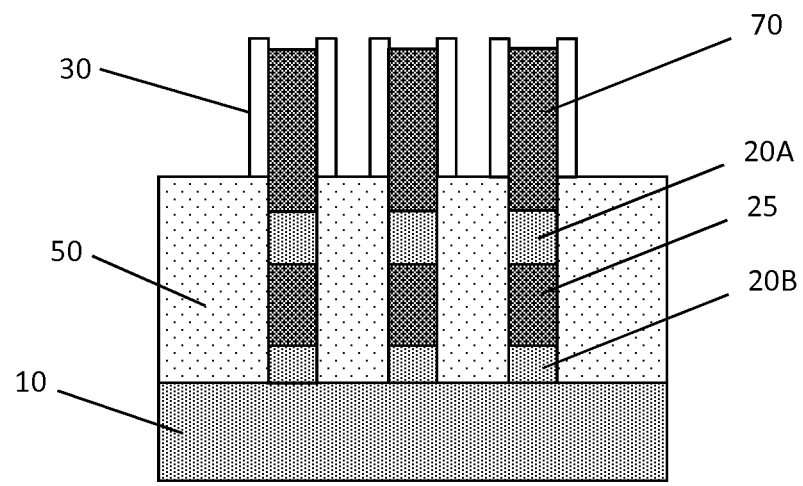
Figure 10:
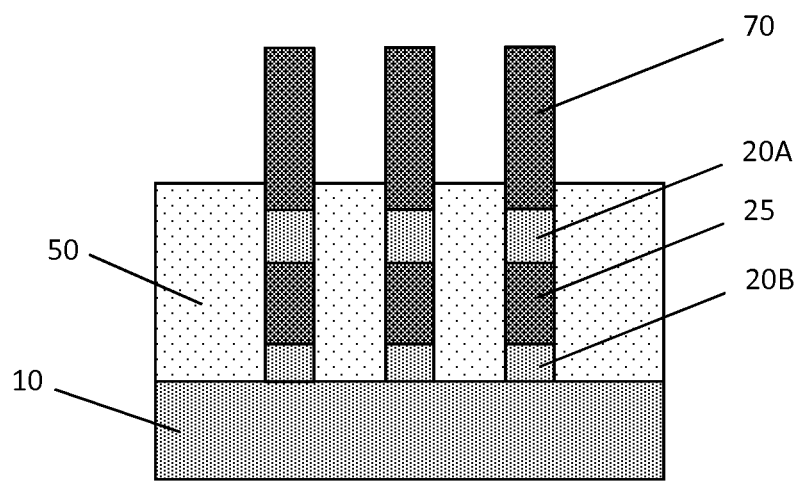

In S106 of FIG. 1, a channel layer 70 is formed, as shown in FIGS. 9 and 10. FIGS. 9 and 10 are exemplary cross sectional views along the Y direction at various stages of the fabrication process according to one embodiment.

As shown in FIG. 9, the channel layer 70 is formed in the recess that is formed by removing part of the upper layers 20A of the fin structures 20. In one embodiment, the channel layer 70 includes epitaxially grown SiGe. The epitaxial growth of the SiGe layer may be performed by using $SiH_4$ and/or $SiH_2Cl_2$ and $GeH_4$ as source gases at a temperature in a range of about 500° C. to about 700° C. and at a pressure in a range of about 10 to about 100 Torr (about 133 Pa to about 1333 Pa). The SiGe channel layer 70 is expressed as $Si_{1-x}Ge_x$, where x is in a range of about 0.1 to about 0.9 in some embodiments, and is in a range about 0.3 to about 0.5 in other embodiments. The channel layer may include one or more layers of compound semiconductors such as SiC, SiP, SiCP, GaAs, InGaAs, InP or GaN.

The SiGe channel layer 70 may be formed at the same height as the dummy gate dielectric layer 30 in some embodiments, and may be formed slightly below the height of the dummy gate dielectric layer 30 in other embodiments.

Since the SiGe channel layer 70 is formed in the space (recess) that had been filled with the upper layer 20A, the width of the SiGe channel layer 70 is substantially the same as the width of the remaining upper layer 20A. On a side surface at the interface of the SiGe channel layer 70 and the remaining upper layer 20A, there is substantially no step or discontinuity (and, if any, only a few angstroms). The thickness of the remaining upper layer 20A is in a range of about 1 nm to about 50 nm in some embodiments, and may be in a range of about 20 nm to about 40 nm.

As shown in FIG. 10, the dummy gate dielectric 30 is removed by, for example, wet etching, so that the SiGe channel layer 70 is exposed. As shown in FIG. 10, the bottom of the SiGe channel layer 70 is embedded in the isolation insulating layer 50. Accordingly, semiconductor fin structures including a SiGe channel layer 70, a Si strain layer 20A, a SiGe layer 25 and Si layer 20B are formed.

Figure 11:
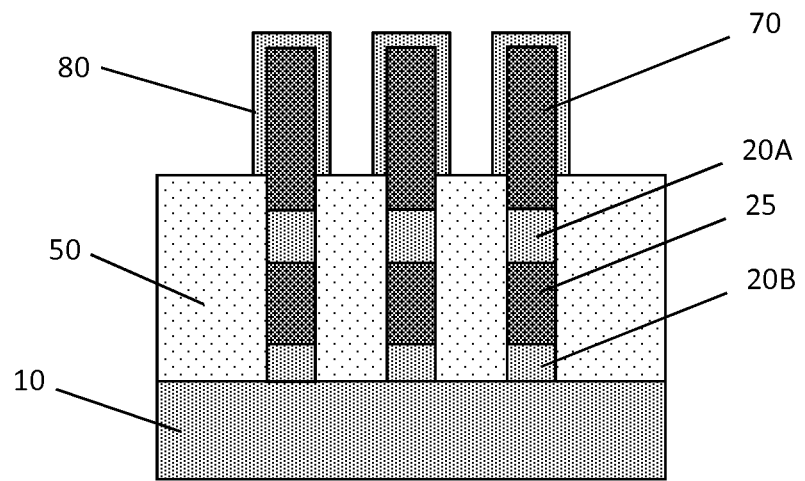

In S107 of FIG. 1, a cap layer 80 is formed, as shown in FIG. 11. FIG. 11 is an exemplary cross sectional view along the Y direction at one of the various stages of the fabrication process according to one embodiment. In some embodiments, the cap layer 80 may not be formed.

In one embodiment of the present disclosure, the cap layer 80 includes epitaxially grown Si or a silicon compound (e.g., SiC, SiP or SiCP). When the channel layer 70 is formed by SiGe, the cap layer 80 may suppress diffusion of germanium in subsequent thermal operations and can improve an interface structure between a channel and a gate dielectric. The epitaxial growth of the Si cap layer 80 may be performed by using $SiH_4$ and/or $SiH_2Cl_2$ as source gases at a temperature in a range of about 500° C. to about 700° C. and at a pressure in a range of about 10 to about 100 Torr (about 133 Pa to about 1333 Pa). The thickness of the Si cap layer 80 is in a range of 0.1 nm to 50 nm in some embodiments, and in a range of about 0.5 nm to about 2 nm in other embodiments. The Si cap layer 80 may be formed by an atomic layer deposition (ALD) method. In certain embodiments, the cap layer 80 is not formed.

Figure 12:
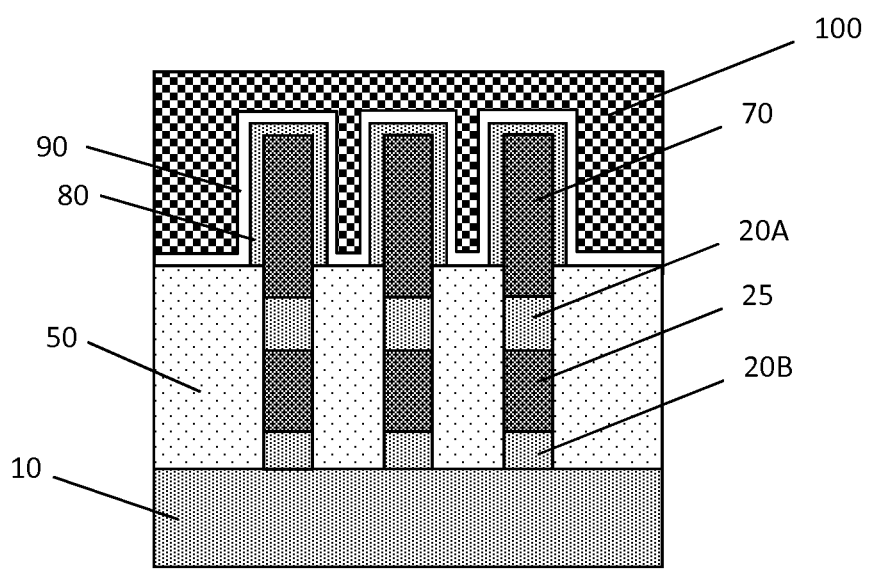

In S108 of FIG. 1, a metal gate structure 100 is formed, as shown in FIG. 12. FIG. 12 is an exemplary cross sectional view along the Y direction at one of the various stages of the fabrication process according to one embodiment.

A gate dielectric layer 90 is formed over an interface layer (not shown) disposed over the channel layer 70. The interface layer may include silicon oxide with a thickness of 0.2 nm to 1.5 nm in some embodiments. The silicon oxide interface layer may be formed by oxidizing the Si cap layer 80. In other embodiments, the thickness of the interface layer is in a range about 0.5 nm to about 1.0 nm. The gate dielectric layer 90 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 90 is formed by, for example, chemical vapor deposition (CVD), physical vapor deposition (PVD), atomic layer deposition (ALD), high density plasma CVD (HDP-CVD), or other suitable methods, and/or combinations thereof. The thickness of the gate dielectric layer 90 is in a range of about 1 nm to about 10 nm in some embodiments, and may be in a range of about 2 nm to about 7 nm in other embodiments. In some embodiments, the gate dielectric layer 90 may include an interfacial layer made of silicon dioxide.

A gate electrode 100 is formed over the gate dielectric layer 90, as shown in FIG. 12. The gate electrode 100 include one or more layers of any suitable materials, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer 90 and the gate electrode 100. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the p-type Fin FET, one or more of TiAlC, Al, TiAl, TaN, TaAlC, TiN, TiC and Co may be used as the work function adjustment layer.

It is understood that the Fin FET device may undergo further CMOS processes to form various features such as contacts/vias, interconnect metal layers, dielectric layers, passivation layers, etc.

FIGS. 13-16 show exemplary processes for manufacturing the Fin FET device according to another embodiment of the present disclosure.

Figure 13:
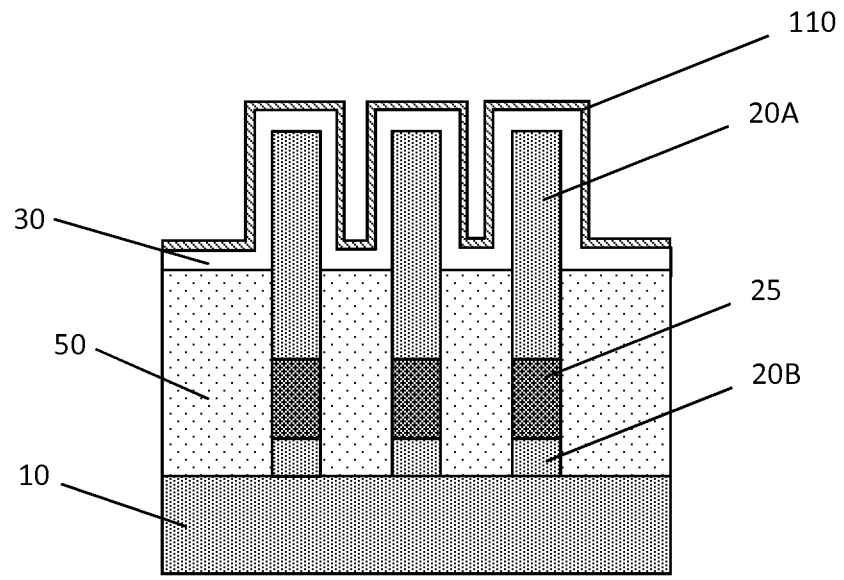
FIGS. 13-16 show exemplary processes for manufacturing the Fin FET device according to another embodiment of the present disclosure.

After the dummy gate electrode 45 is removed as shown in FIG. 6, a hard mask layer 110 is formed over the dummy gate dielectric 30, as shown in FIG. 13. FIG. 13 is an exemplary cross sectional view along the Y direction at one of the various stages of the fabrication process according to one embodiment.

In one embodiment of the present disclosure, the hard mask layer 110 includes one or more layers of metal nitride, metal oxynitride or metal carbo-oxy-nitride, such as titanium nitride (TiN), silicon nitride (SiN), SiCN, SiOCN, SiON or tantalum nitride (TaN). In this embodiment, TiN is used. The thickness of the hard mask layer 110 is in a range of about 1 nm to about 5 nm in some embodiments, and in a range of about 1 nm to about 3 nm in other embodiments. The hard mask layer 110 is formed by, for example, CVD, PVD including sputtering, ALD, HDPCVD, or other suitable methods, and/or combinations thereof.

Figure 14:
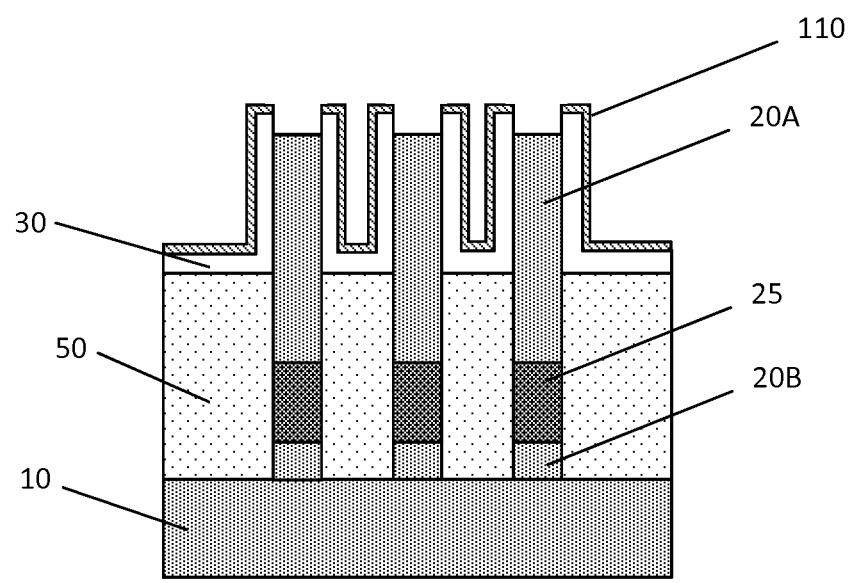

FIG. 14 is an exemplary cross sectional view along the Y direction at one of the various stages of the fabrication process according to one embodiment. As shown in FIG. 14, a top of the dummy gate electrode 30 and the hard mask layer 110 that cover the top surface of the upper layer 20A is removed by using, for example dry etching. Since the etching rate at the fin top is faster than that at the fin side, substantially only the fin top portion can be removed.

Figure 15:
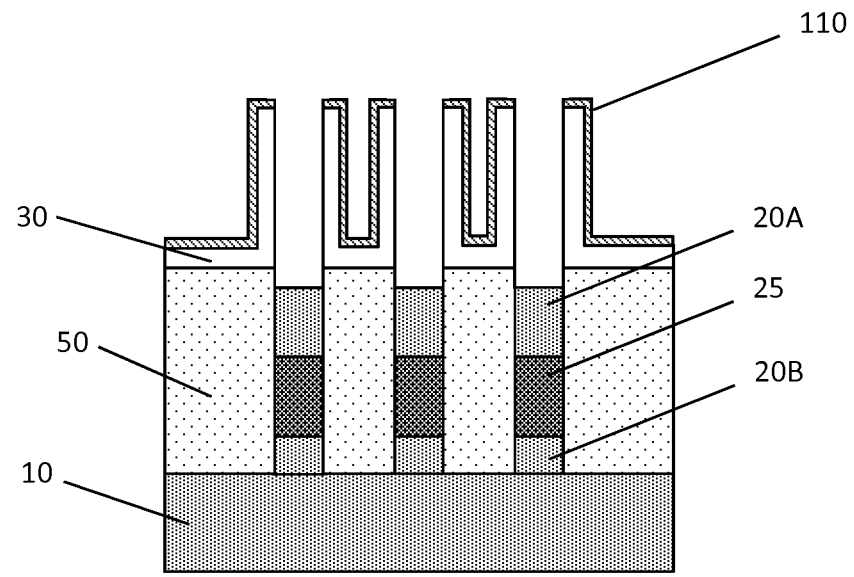

FIG. 15 is an exemplary cross sectional view along the Y direction at one of the various stages of the fabrication process according to one embodiment. Similar to FIG. 8, part of the upper layers 20A of the fin structures 20 are removed (recessed) down below the upper surface of the isolation insulating layer 50 by using a fluorine containing gas (e.g., $NF_3$), $H_2$ and inert gas (e.g., Ar), as shown in FIG. 15.

Figure 16:
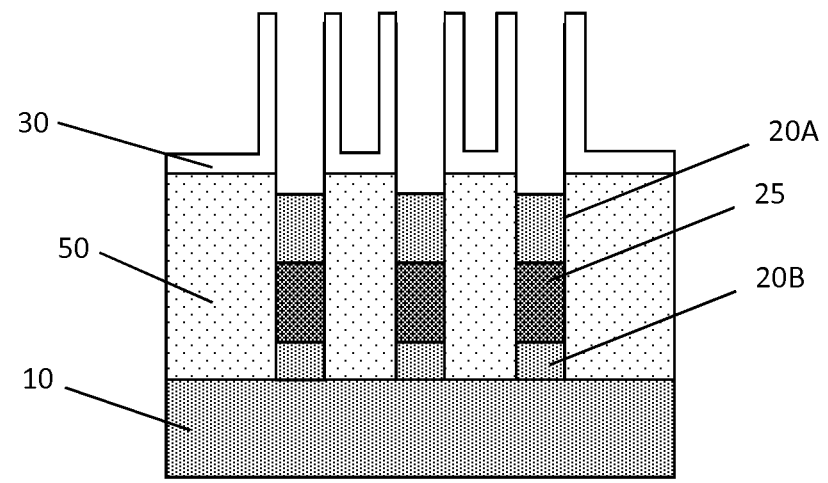

FIG. 16 is an exemplary cross sectional view along the Y direction at one of the various stages of the fabrication process according to one embodiment. As shown in FIG. 16, the hard mask layer 110 is removed. In one embodiment of the present disclosure, wet etching is used to remove the TiN hard mask layer 110.

After the hard mask layer 110 is removed, the operations described with respect to FIGS. 8-12 are performed.

Figure 17:
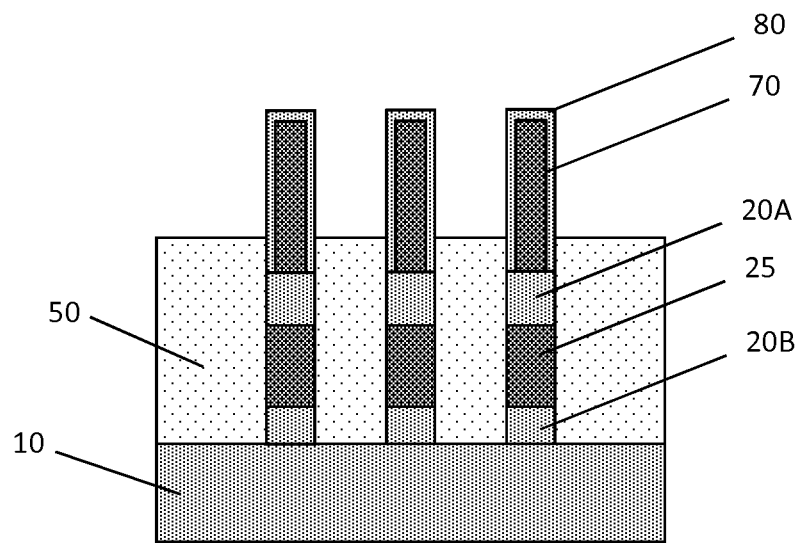
FIGS. 17 and 18 show exemplary processes for manufacturing the Fin FET device according to another embodiment of the present disclosure.
Figure 18:
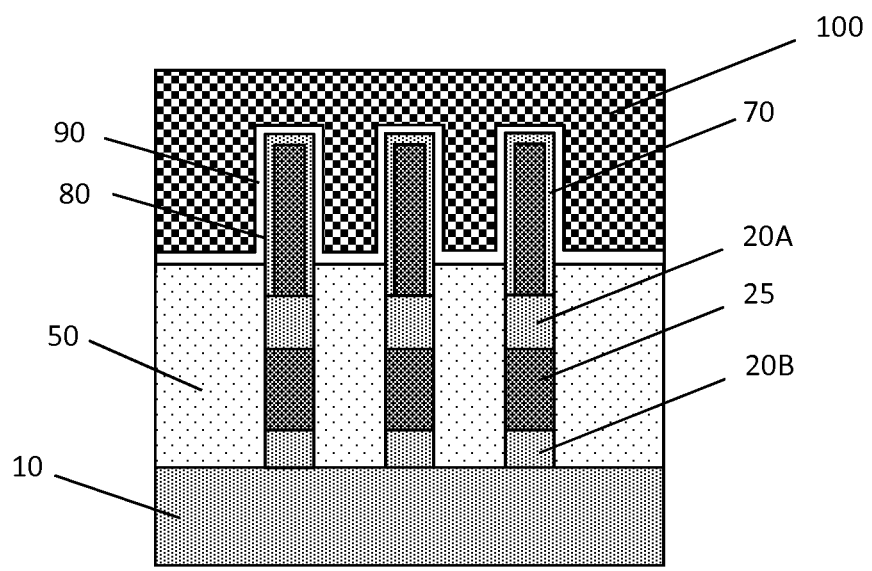

FIGS. 17 and 18 show exemplary processes for manufacturing the Fin FET device according to another embodiment of the present disclosure.

FIG. 17 is an exemplary cross sectional view along the Y direction at one of the various stages of the fabrication process according to one embodiment. After the channel layer 70 is formed as shown in FIG. 10, the channel layer 70 is trimmed so that the width of the channel layer 70 is reduced. When the channel layer 70 is SiGe, wet etching using, for example, a mixture of $NH_4OH$, $H_2O_2$ and $H_2O$, is performed to trim the channel layer 70. By this wet etching, the width of SiGe channel layer 70 is reduced by an amount of about 0.5 nm to about 5 nm in some embodiments. In other embodiments, the reduced amount is in a range of about 1 nm to about 3 nm.

After the width of the channel layer 70 is reduced, similar to FIG. 11, a cap layer 80 is formed, as shown in FIG. 17. In this embodiment, the cap layer 80 is Si.

FIG. 18 is an exemplary cross sectional view along the Y direction at one of the various stages of the fabrication process according to one embodiment. Similar to FIG. 12, a metal gate structure 100 is formed.

In this embodiment, the reduced amount of the SiGe channel layer 70 and the thickness of the Si cap layer 80 are adjusted such that the total width of the SiGe channel layer 70 becomes a desirable width.

The various embodiments or examples described herein offer several advantages over the existing art. For example, in the present disclosure, since a SiGe channel layer is formed after the source/drain are formed, the SiGe layer would not undergo many thermal operations (e.g., epitaxial growth for the source/drain, etc). If the SiGe channel layer is first formed and then the source/drain are formed, germanium in the SiGe channel layer likely diffuse into the dummy gate electrode (e.g., poly silicon dummy gate electrode). If germanium is diffused into the poly silicon dummy electrode, poly silicon residue tends to remain between the fin structures after the dummy gate electrode removal, which would degrade the FET performance. Further, because of the many thermal operations, the surface roughness of the SiGe channel layer tends to increase. The surface roughness (RMS) of the SiGe channel layer may be more than 0.2 nm.

However, in the present disclosure, it is possible to avoid germanium diffusion into a dummy poly silicon gate electrode through a dummy gate dielectric layer. Further, since the SiGe channel layer undergoes fewer thermal operations, it is possible to maintain a smooth surface of the SiGe channel layer. The surface roughness (RMS) of the SiGe channel layer in the present disclosure is less than 0.2 nm in some embodiments, and may be less than 0.15 nm in other embodiments. Further, it is possible to more precisely control the width of the SiGe channel layer.

It will be understood that not all advantages have been necessarily discussed herein, no particular advantage is required for all embodiments or examples, and other embodiments or examples may offer different advantages.

In accordance with one aspect of the present disclosure, a method of manufacturing a semiconductor device including a Fin FET, includes forming a fin structure over a substrate. The fin structure extends in a first direction and includes an upper layer. Part of the upper layer is exposed from an isolation insulating layer. A dummy gate structure is formed over part of the fin structure. The dummy gate structure includes a dummy gate electrode layer and a dummy gate dielectric layer. The dummy gate structure extends in a second direction perpendicular to the first direction. A source and a drain are formed. An interlayer insulating layer is formed over the dummy gate structure, the fin structure and the isolation insulating layer. The dummy gate electrode is removed so that the upper layer covered by the dummy gate dielectric layer is exposed. The upper layer is recessed to make a recess formed by the dummy gate dielectric layer. Part of the upper layer remains at a bottom of the recess. A channel layer is formed in the recess. The dummy gate dielectric layer is formed. A gate structure is formed over the channel layer.

In accordance with another aspect of the present disclosure, a method of manufacturing a semiconductor device including a Fin FET, includes forming a fin structure over a substrate. The fin structure extends in a first direction and includes an upper layer. Part of the upper layer is exposed from an isolation insulating layer. A dummy gate structure is formed over part of the fin structure. The dummy gate structure includes a dummy gate electrode layer and a dummy gate dielectric layer. The dummy gate structure extends in a second direction perpendicular to the first direction. A source and a drain are formed. An interlayer insulating layer is formed over the dummy gate structure, the fin structure and the isolation insulating layer. The dummy gate electrode is removed so that the upper layer covered by the dummy gate dielectric layer is exposed. A hard mask layer is formed over the exposed dummy gate dielectric layer. The hard mask and the dummy gate dielectric layer are patterned so that an upper surface of the upper layer is exposed. The upper layer is recessed to make a recess formed by the dummy gate dielectric layer. Part of the upper layer remains at a bottom of the recess. A channel layer is formed in the recess. The hard mask layer and the dummy gate dielectric layer are removed. A gate structure is formed over the channel layer.

In accordance with another aspect of the present disclosure, a semiconductor device including a Fin FET includes a fin structure disposed over a substrate, a gate structure and a source and a drain. The fin structure extends in a first direction and includes a stressor layer and a channel layer disposed over the stressor layer. The gate structure includes a gate electrode layer and a gate dielectric layer, covers a portion of the fin structure, and extends in a second direction perpendicular to the first direction. Each of the source and the drain includes a stressor material. No step is formed on a side surface of the fin structure at an interface between the stressor layer and the channel layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a Fin FET, the method comprising:
    forming a fin structure over a substrate, the fin structure extending in a first direction and including an upper layer, part of the upper layer being exposed from an isolation insulating layer;
    forming a dummy gate structure over part of the fin structure, the dummy gate structure including a dummy gate electrode layer, a dummy gate dielectric layer and sidewall spacers disposed on both sidewalls of the dummy gate electrode layer, the dummy gate structure extending in a second direction perpendicular to the first direction;
    forming a source and a drain;
    forming an interlayer insulating layer over the dummy gate structure, the fin structure and the isolation insulating layer:
    after the interlayer insulating layer is formed, removing the dummy gate electrode layer;
    after the dummy gate electrode layer is removed, removing a part of the dummy gate dielectric layer that covers an upper surface of the upper layer so that the upper surface of the upper layer is exposed;
    after the upper surface of the upper layer is exposed, recessing the upper layer of the fin structure to make a recess formed by an unremoved portion of the dummy gate dielectric layer and a portion of the isolation insulating layer, part of the upper layer remaining at a bottom of the recess and the bottom of the recess being located below an upper surface of the isolation insulating layer;

forming a channel layer in the recess such that the channel layer protrudes from the isolation insulating layer and sidewalls of the channel layer are in contact with the unremoved portion of the dummy gate dielectric layer;

after the channel layer is formed in the recess, removing the unremoved portion of the dummy gate dielectric layer such that the sidewalls of the channel layer are exposed; and after the unremoved portion of the dummy gate dielectric layer is removed, forming a gate structure over the channel layer to cover a top and the exposed sidewalls of the channel layer.

2. The method of claim 1, wherein the channel layer includes a compound semiconductor.

3. The method of claim 1, wherein the channel layer includes $Si_{1-x}Ge_x$, where x is 0.1 to 0.9.

4. The method of claim 2, wherein:
the upper layer of the fin structure includes Si, and
the channel layer is disposed on the remaining upper layer.

5. The method of claim 2, further comprising forming a cap layer to cover the channel layer,
wherein the gate structure is formed over the cap layer covering the channel layer.

6. The method of claim 5, wherein the cap layer includes Si or a silicon compound.

7. The method of claim 3, wherein the fin structure further includes:
an intermediate layer disposed under the upper layer; and
a base layer disposed under the intermediate layer.

8. The method of claim 7, wherein the intermediate layer includes $Si_{1-x}Ge_x$, where x is 0.1 to 0.9, or a compound including Si and Ge.

9. The method of claim 1, further comprising:
trimming the channel layer so as to reduce a width of the channel layer; and
forming a cap layer to cover the trimmed channel layer,
wherein the gate structure is formed over the cap layer covering the trimmed channel layer.

10. The method of claim 3, further comprising forming a cap layer to cover the channel layer,
wherein the gate structure is formed over the cap layer covering the channel layer.

11. The method of claim 10, wherein the cap layer includes Si.

12. The method of claim 10, wherein the cap layer includes one of SiC, SiP and SiCP.

13. The method of claim 1, wherein the channel layer includes $Si_{1-x}Ge_x$, where x is 0.3 to 0.5.

14. A method of manufacturing a semiconductor device including Fin FETs, the method comprising:
forming fin structures over a substrate, the fin structures extending in a first direction and including an upper layer,
forming an isolation insulating layer over the substrate such that upper portions of the fin structures are exposed from the isolation insulating layer;
forming a dummy gate structure over part of the upper portions of the fin structures, the dummy gate structure including a dummy gate electrode layer, a dummy gate dielectric layer and sidewall spacers disposed on both sidewalls of the dummy gate electrode layer, the dummy gate structure extending in a second direction perpendicular to the first direction;

forming source/drain structures over the upper portions of the fin structures not covered by the dummy gate structure;

forming an interlayer insulating layer over the dummy gate structure, the fin structure and the isolation insulating layer;

after the interlayer insulating layer is formed, removing the dummy gate electrode layer;

after the dummy gate electrode layer is removed, removing a part of the dummy gate dielectric layer that covers upper surfaces of the upper layer so that the upper surfaces of the upper portions of the fin structures are exposed;

after the upper surfaces of the upper portions are exposed, recessing the upper portions of the fin structures to make recesses formed by an unremoved portion of the dummy gate dielectric layer and a portion or the isolation insulating layer, bottoms of the recesses being located below an upper surface of the isolation insulating layer;

forming channel layers in the recesses such that the channel layers protrude from the isolation insulating layer and sidewalls of the channel layers are in contact with the unremoved portion of the dummy gate dielectric layer;

after the channel layers are formed, removing the unremoved portion of the dummy gate dielectric layer such that the sidewalls of the channel layers are exposed; and after the unremoved portion of the dummy gate dielectric layer is removed, forming a gate structure over the channel layers to cover a top and the exposed sidewalls of the channel layers.

15. The method of claim 14, wherein the upper portions are recessed below the upper surface of the isolation insulating layer.

16. The method of claim 14, wherein the channel layers are formed such that upper surfaces of the channel layers are located below an upper surface of the unremoved portion of the dummy gate dielectric layer.

17. A method of manufacturing a semiconductor device including a Fin FET, the method comprising:
forming a fin structure over a substrate, the fin structure extending in a first direction and including an upper layer, part of the upper layer being exposed from an isolation insulating layer, the fin structure including an intermediate layer disposed under the upper layer and a base layer disposed under the intermediate layer;

forming a dummy gate structure over part of the fin structure, the dummy gate structure including a dummy gate electrode layer, a dummy gate dielectric layer and sidewall spacers disposed on both sidewalls of the dummy gate electrode layer, the dummy gate structure extending in a second direction perpendicular the first direction;

forming a source and a drain;

forming an interlayer insulating layer over the dummy gate structure, the fin structure and the isolation insulating layer;

after the interlayer insulating layer is formed, removing the dummy gate electrode layer;

after the dummy gate electrode layer is removed, removing a part of the dummy gate dielectric layer that covers an upper surface of the upper layer so that the upper surface of the upper layer of the fin structure is exposed;

after the upper surface of the upper layer is exposed, recessing the upper layer of the fin structure to make a recess formed by an unremoved portion of the dummy gate dielectric layer and a portion of the isolation insulating layer, a bottom of the recess being located below an upper surface of the isolation insulating layer;

forming a channel layer in the recess such that the channel layer protrudes from the isolation insulating layer and sidewalls of the channel layer are in contact with the unremoved portion of the dummy gate dielectric layer;

after the channel layer is formed, removing the unremoved portion of the dummy gate dielectric layer such that the sidewalls of the channel layer are exposed; and after the unremoved portion of the dummy gate dielectric layer is removed, forming a gate structure over the channel layer to cover a top and the exposed sidewalls of the channel layer.

18. The method of claim 17, wherein:

the intermediate layer is made of a different material than the base layer, and the upper layer includes silicon.

19. The method of claim 17, wherein:

the base layer and the upper layer include silicon, and the intermediate layer includes $Si_{1-x}Ge_x$, where x is 0.1 to 0.9.

* * * * *